(12) United States Patent
Oshio et al.

(10) Patent No.: US 7,291,866 B2
(45) Date of Patent: Nov. 6, 2007

(54) SEMICONDUCTOR LIGHT EMITTING DEVICE AND SEMICONDUCTOR LIGHT EMITTING UNIT

(75) Inventors: Hiroaki Oshio, Fukuoka-ken (JP); Iwao Matsumoto, Fukuoka-ken (JP); Takeshi Miyakawa, Kanagawa-ken (JP); Hatsuo Takezawa, Kanagawa-ken (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 11/149,461

(22) Filed: Jun. 10, 2005

(65) Prior Publication Data

US 2005/0280017 A1   Dec. 22, 2005

(30) Foreign Application Priority Data

Jun. 11, 2004   (JP) .............................. 2004-174455

(51) Int. Cl.
*H01L 29/22*   (2006.01)
(52) U.S. Cl. ......... 257/99; 257/E33.058; 257/E33.056; 257/E33.001
(58) Field of Classification Search ................ 257/99, 257/E33.001, E33.056, E33.058, E33.066
See application file for complete search history.

(56) References Cited

U.S. PATENT DOCUMENTS

| | | | |
|---|---|---|---|
| 5,245,620 A * | 9/1993 | Tanaka et al. ................ 372/36 | |
| 6,335,548 B1 | 1/2002 | Roberts et al. | |
| 6,517,218 B2 | 2/2003 | Hochstein | |
| 6,650,020 B2 * | 11/2003 | Yamada et al. ............. 257/783 | |
| 6,670,751 B2 | 12/2003 | Song et al. | |
| 6,770,498 B2 * | 8/2004 | Hsu ............................ 438/26 | |
| 2002/0043926 A1 * | 4/2002 | Takahashi et al. .......... 313/503 | |
| 2004/0061433 A1 * | 4/2004 | Izuno et al. ................. 313/498 | |
| 2004/0251469 A1 * | 12/2004 | Yatsuda et al. ............. 257/100 | |

FOREIGN PATENT DOCUMENTS

CN   1585143 A   2/2005

(Continued)

OTHER PUBLICATIONS

CN Office Action dated Mar. 9, 2007, CN Patent Appln. No. 2005100778983.

*Primary Examiner*—Jerome Jackson
*Assistant Examiner*—Mohammad T. Karimy
(74) *Attorney, Agent, or Firm*—Banner & Witcoff, Ltd.

(57) ABSTRACT

A semiconductor light emitting device comprises: embedding resin; a first lead having a first inner lead section embedded in the embedding resin and a first outer lead section protruding from one side face of the embedding resin; a second lead having a second inner lead section embedded in the embedding resin and a second outer lead section protruding from a side face opposed to the one side face of the embedding resin; a semiconductor light emitting chip mounted on a portion of the first inner lead section exposed in a recess provided on an upper face of the embedding resin; and a wire connecting the semiconductor light emitting chip with the second lead. The first and second inner lead sections and the first and second outer lead sections each have a substantially coplanar rear face. At least a part of the rear face of the first inner lead section and at least a part of the rear face of the second inner lead section are not covered with the embedding resin but are exposed.

20 Claims, 14 Drawing Sheets

FOREIGN PATENT DOCUMENTS

| | | |
|---|---|---|
| JP | 2002-252373 | 9/2002 |
| JP | 2003-174200 | 6/2003 |
| JP | 2003-176334 | 6/2003 |
| JP | 2003-179269 | 6/2003 |
| JP | 2003-318448 | 11/2003 |

* cited by examiner

SEMICONDUCTOR LIGHT EMITTING DEVICE AND SEMICONDUCTOR LIGHT EMITTING UNIT

CROSS-REFERENCE TO RELATED APPLICATIONS

This application is based upon and claims the benefit of priority from the prior Japanese Patent Application No. 2004-174455, filed on Jun. 11, 2004; the entire contents of which are incorporated herein by reference.

BACKGROUND OF THE INVENTION

This invention relates to a semiconductor light emitting device and a semiconductor light emitting unit, and more particularly to a semiconductor light emitting device suitable to applications requiring high current drive such as backlights for liquid crystal displays and high power LED (light emitting diode) lamps, and a semiconductor light emitting unit with this semiconductor light emitting device being mounted.

In recent years, LEDs, among other semiconductor light emitting devices, have shown a remarkable progress in technology, including white light emitting LEDs using ultraviolet excitation of phosphors. Light emission of every display color on the CIE (International Commission on Illumination) coordinates has been made possible. This has further expanded new applications in various LED displays and liquid crystal display backlights, including in-vehicle applications (stop lamp, tail lamp, dashboard, etc.), traffic signals, and portable devices. The demand for device downsizing and high density packaging in these especially new applications requires a surface mount device (SMD) (see, e.g., Japanese Laid-Open Patent Application 2003-60240).

The driving current for conventional SMD semiconductor light emitting devices has an upper limit of about 50 milliamperes because they have high thermal resistance, and thus they can be driven only by low current. Therefore many LEDs must be mounted in applications requiring high power.

On the other hand, in a high current package developed for power transistors, a lead frame with a die-bonded chip is attached to a heat sink with an adhesive having high thermal conductivity, thereby addressing high current operation. However, this structure has room for improvement at the following points:

1. Thermal resistance of the adhesive layer has not been sufficiently reduced.
2. Many assembly steps are involved, which increases assembly cost.
3. The cost rises due to increase in the number of components (heat sink, lead frame, adhesive, etc.).

Additionally, a semiconductor light emitting device with a lead frame having higher thermal conductivity for driving an LED at high current suffers large thermal stress in the solder reflow process. That is, heat for reflow is easier to be transmitted to the LED in the solder reflow process. For this reason, use of a less heat-resistant adhesive such as silver paste for mounting the LED may cause degradation in reliability including degradation in adhesion strength. It is thus desirable to use a highly heat-resistant adhesive such as eutectic solder for mounting an LED. However, conventional SMDs have another problem that it is difficult to mount the LED using eutectic solder because resin for molding the inner lead section of a lead frame has a low heat resistance temperature.

SUMMARY OF THE INVENTION

According to an aspect of the invention, there is provided a semiconductor light emitting device comprising:
embedding resin;
a first lead having a first inner lead section embedded in the embedding resin and a first outer lead section protruding from one side face of the embedding resin;
a second lead having a second inner lead section embedded in the embedding resin and a second outer lead section protruding from a side face opposed to the one side face of the embedding resin;
a semiconductor light emitting chip mounted on a portion of the first inner lead section exposed in a recess provided on an upper face of the embedding resin; and
a wire connecting the semiconductor light emitting chip with the second lead,
the first and second inner lead sections and the first and second outer lead sections each having a substantially coplanar rear face, and
at least a part of the rear face of the first inner lead section and at least a part of the rear face of the second inner lead section being not covered with the embedding resin but being exposed.

According to other aspect of the invention, there is provided a semiconductor light emitting unit comprising:
a mounting substrate having a first electrode pad and a second electrode pad; and
a semiconductor light emitting device including:
embedding resin;
a first lead having a first inner lead section embedded in the embedding resin and a first outer lead section protruding from one side face of the embedding resin;
a second lead having a second inner lead section embedded in the embedding resin and a second outer lead section protruding from a side face opposed to the one side face of the embedding resin;
a semiconductor light emitting chip mounted on a portion of the first inner lead section exposed in a recess provided on an upper face of the embedding resin; and
a wire connecting the semiconductor light emitting chip with the second lead,
the first and second inner lead sections and the first and second outer lead sections each having a substantially coplanar rear face, and
at least a part of the rear face of the first inner lead section and at least a part of the rear face of the second inner lead section being not covered with the embedding resin but being exposed,
one of the first and second outer lead sections being connected with one of the first and second electrode pads, and
other of the first and second outer lead sections being connected with other of the first and second electrode pads.

DETAILED DESCRIPTION OF THE INVENTION

Embodiments of the invention will now be described with reference to the drawings.

Figure 1:
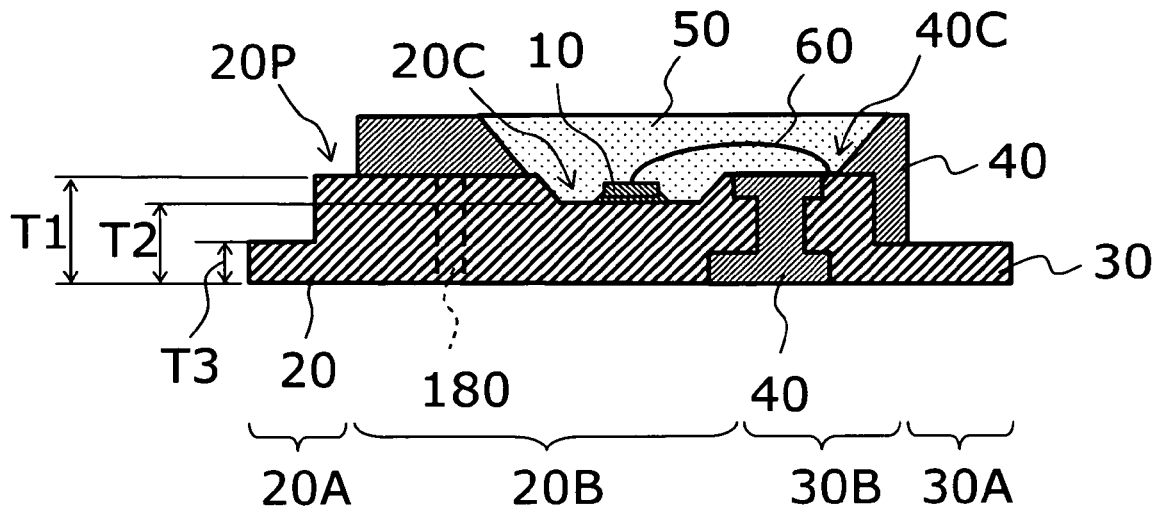
FIG. 1 is a schematic cross-sectional view illustrating the configuration of the relevant part of a semiconductor light emitting device according to an embodiment of the invention.

FIG. 1 is a schematic cross-sectional view illustrating the configuration of the relevant part of a semiconductor light emitting device according to an embodiment of the invention.

Figure 2:
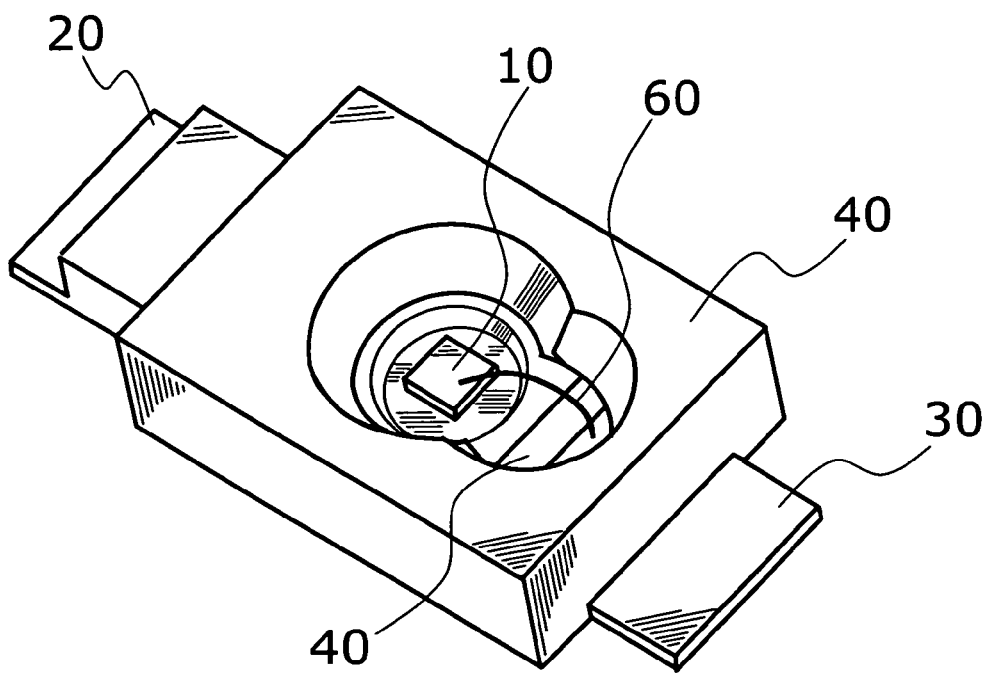
FIG. 2 is a schematic perspective view of the semiconductor light emitting device of the embodiment of the invention as viewed obliquely from above.

FIG. 2 is a schematic perspective view of the semiconductor light emitting device as viewed obliquely from above.

Figure 3:
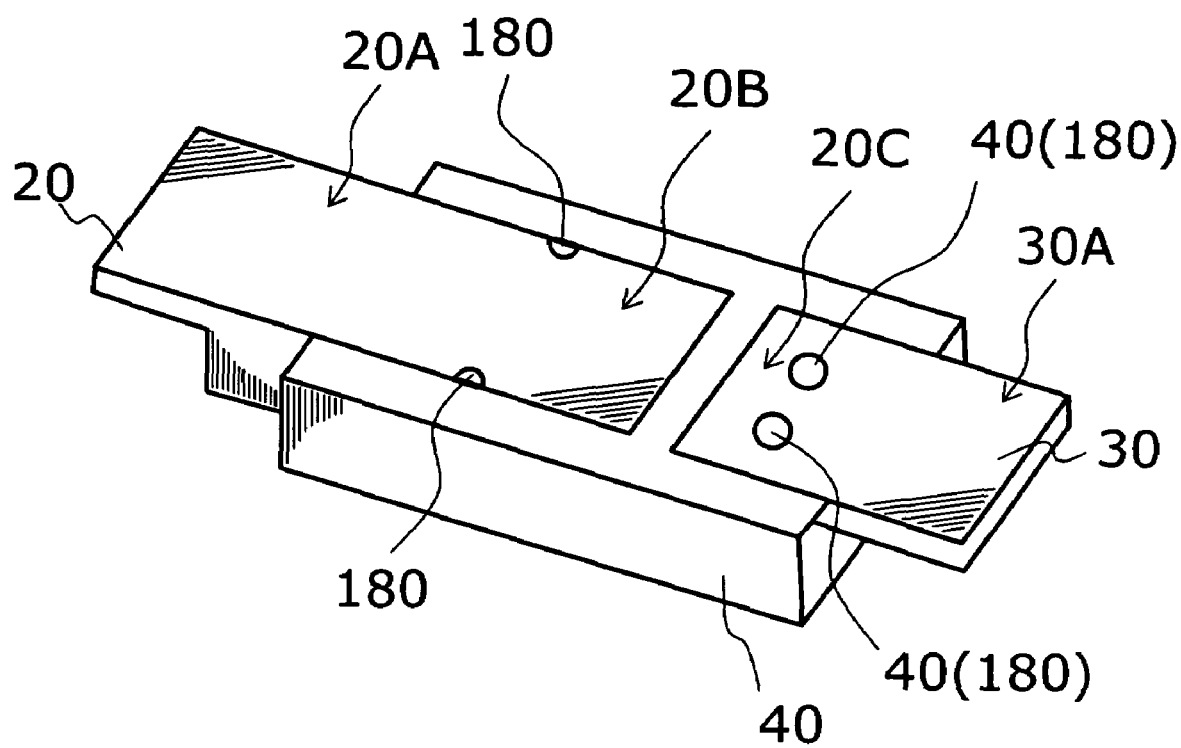
FIG. 3 is a schematic perspective view of the semiconductor light emitting device of the embodiment of the invention as viewed obliquely from below.

FIG. 3 is a schematic perspective view of the semiconductor light emitting device as viewed obliquely from below.

More specifically, the semiconductor light emitting device of this embodiment, which is a light emitting device of the so-called surface mount device (SMD) type, comprises a pair of leads 20 and 30, and embedding resin 40 formed to encompass inner lead sections 20B and 30B of the leads 20 and 30. A semiconductor light emitting chip 10 (hereinafter referred to as "LED chip") is mounted on the lead 20. This semiconductor light emitting device can be mounted, for example, on an electrode pattern of various mounting substrates by soldering or welding outer lead sections 20A and 30A.

In this embodiment, as shown in FIG. 3, the inner lead sections 20B and 30B of the leads have rear faces exposed on the bottom face (mounting surface) of the semiconductor light emitting device. That is, the portion of the lead 20 directly below the semiconductor light emitting chip (LED chip) 10 is not covered with the resin 40 and exposed.

The exposed portion directly below the LED chip 10 can be soldered onto a mounting substrate (not shown) to efficiently dissipate heat generated in the LED chip 10 toward the mounting substrate. It should be noted that in FIG. 3, the resin 40 filling in anchor holes 180 is seen on the rear side of the semiconductor light emitting device, which will be described later in detail with reference to FIGS. 5A and 5B.

In this embodiment, the thickness T2 of the lead 20 measured directly below the LED chip 10 is greater than the thickness T3 of the tip of the outer lead section 20A (where it is soldered). This facilitates cooling because the greater thickness of metal directly below the LED chip 10 enhances heat sink effect. On the other hand, it is desirable that the tip of the outer leads 20A and 30A be not thicker than conventional one in view of the lead cutting process and connection to the mounting substrate described later in detail.

It should be noted that the thickness of the inner lead section 30B of the lead 30 does not necessarily need to be equal to the thickness T1 of the inner lead section 20B. However, with these thicknesses being comparable, wire 60 connected from the LED chip 10 can have a comparable height at both ends, which facilitates wire bonding. In addition, the wire can be bonded in the condition that the bonding portion of the lead 30 is firmly supported on a stage of bonding apparatus, because the bonding portion of the lead 30 does not float in the air during wire bonding.

Furthermore, when the thickness of the inner lead section 30B of the lead 30 is comparable to that of the inner lead section 20B of the lead 20, they are less prone to being removed from the resin 40, which enhances the mechanical strength of the semiconductor light emitting device.

Figure 4:
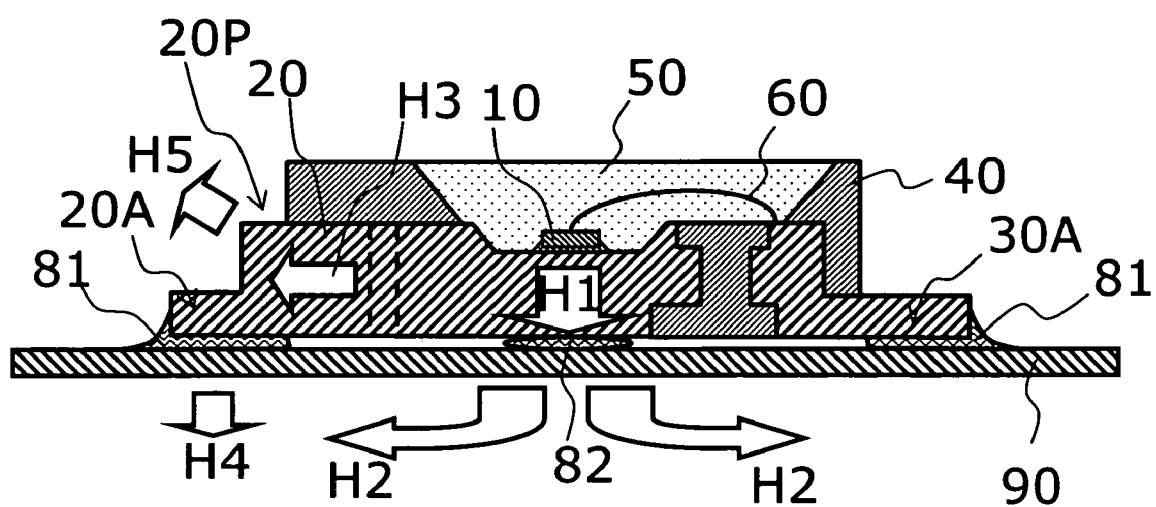
FIG. 4 is a schematic cross-sectional view showing the semiconductor light emitting device of this embodiment as mounted on a substrate.

FIG. 4 is a schematic cross-sectional view showing a semiconductor light emitting unit having a substrate on which the semiconductor light emitting device of this embodiment is mounted.

More specifically, the semiconductor light emitting unit of this embodiment comprises a substrate 90 such as a printed circuit board and a semiconductor light emitting device mounted thereon. Before soldering the semiconductor light emitting device onto the substrate 90 by solder reflow process, a solder pad portion is provided on the substrate 90, where solder paste is applied by screen printing or the like. The outer leads 20A and 30A are then connected to an electrode pattern on the substrate 90 with solder 81, respectively. At the same time, the portion of the lead 20 directly below the chip is connected to the electrode pattern on the substrate 90 with solder 82.

In this way, in this embodiment, the rear face of the pair of leads 20 and 30 has a flat surface, which is identical to the mounting surface. This eliminates the need to fold or bend the outer leads 20A and 30A for mounting. The flat rear face may be directly soldered onto the mounting surface. In addition, since the rear face of the leads 20 and 30 is the same flat surface as the mounting surface, the soldered area can be made sufficiently large, which can sufficiently increase the mounting strength of the semiconductor light emitting device with respect to the mounting substrate.

The semiconductor light emitting device of this embodiment can be bonded to the electrode pad portion of the substrate 90 via solder 82 because the lead directly below the chip is exposed on the bottom face. Heat generated by high current injected into the p-n junction of the LED chip 10 is dissipated downward as shown by arrow H1 in the figure, and efficiently diffused into the substrate 90 as shown by arrow H2 via the solder bond 82 directly below the chip 10. This allows stable, high power operation of the device even under high current flow. Therefore the device can be used in various applications including, for example, backlights of a liquid crystal display, high brightness display panels, in-vehicle stop lamps, tail lamps, and head lamps, and spotlights for toilet or other rooms, for which conventional semiconductor light emitting units cannot provide sufficient illumination.

In addition, in this embodiment, the thicker portion of the lead 20 has a protrusion 20P protruding from the resin 40. The protrusion 20P thus provided serves to decrease the thermal resistance of the path shown by arrow H3. That is, part of the heat dissipated from the LED chip 10 can be efficiently diffused into the substrate 90 via solder 81 under the outer lead 20A as shown by arrow H4. Furthermore, the protrusion 20P can facilitate heat dissipation into the air as shown by arrow H5 because it is not covered with the resin 40.

In the following, the configuration of various parts of the semiconductor light emitting device of this embodiment will be described in more detail with reference to FIGS. 1 to 4.

The inner lead section 20B of the lead 20 has a cup-shaped recess 20C. On the other hand, the embedding resin 40 has a recess 40C, at the bottom of which are exposed in part the inner lead sections 20B and 30B including the recess 20C of the lead. The LED chip 10 is die bonded to the bottom face of the recess 20C of the lead 20. Eutectic solder, conductive paste, or gold (Au) bump can be used as an adhesive for die bonding. The electrode of the LED chip 10 is connected to the other inner lead section 30B via bonding wire 60.

The cup-shaped recess 20C has a slanted sidewall, which has a function of reflecting the light emitted from the LED chip 10. The sidewall of the recess 40C of the embedding resin 40 also has a reflecting function. As a result, the light extraction efficiency can be improved. When the sidewall of the recess 20C is formed in an R-shaped or other curved configuration, the light reflectance is increased and high light extraction efficiency is achieved while maintaining desired light distribution characteristics.

In this respect, placing the LED chip 10 near the center of the recess 20C facilitates obtaining uniform light distribution characteristics. The recess 40C provided in the embedding resin 40 may comprise a first conical portion centered on the LED chip 10 and a second conical portion additionally provided for housing the wire 60 as shown in FIG. 2, for example. The recess 40C formed in this way can efficiently reflect upward the light emitted from the LED chip 10 and increase the light extraction efficiency.

On the other hand, as described later in detail, during insert molding process using the embedding resin 40, the mold for resin can be prevented from contacting the LED chip 10 as a result of housing the LED chip 10 in the recess 20C. That is, the embedding resin 40 can be insert molded after the LED chip 10 is mounted on the lead 20. Consequently, as an additional advantageous effect, eutectic solder or other adhesives having a high melting point can be used for bonding the LED chip 10.

The LED chip 10 may be any of various visible light LED chips. Furthermore, various emission colors including white light can be obtained by combining ultraviolet LED chips with phosphors as appropriate. In this way, every color represented by the spectral luminous efficiency curve defined in the CIE (International Commission on Illumination) standard can be realized.

The recess 40C of the embedding resin 40 encompassing the LED chip 10 and the bonding wire 60 is filled with sealing resin 50. It should be noted that in FIG. 2, the sealing resin 50 is omitted for revealing the internal structure.

When the LED chip 10 is a chip made of InGaAlP-based compound semiconductor that emits red or other visible light, the sealing resin 50 may be made of epoxy resin, for example.

On the other hand, when the LED chip 10 is a chip that emits ultraviolet radiation, it is desirable that the sealing resin 50 be made of silicone-based resin. This is because epoxy resin may be discolored by ultraviolet irradiation, while silicone-based resin is not discolored and maintains high light transmittance over time. In addition, a desired emission color is obtained by mixing phosphors in the sealing resin 50 as appropriate.

It is desirable that the pair of leads 20 and 30 be formed from metal. For example, copper (Cu) based alloy may be advantageously used for obtaining high thermal conductivity. Coating its surface by plating or other process serves to increase the light reflectance at the sidewall of the cup-shaped recess 20C and the bonding strength of solder on the rear face of the outer lead sections 20A and 30A and of the lead 20 directly below the chip 10. Such coating may include, for example, silver (Ag), or nickel (Ni)/palladium (Pd)/gold (Au) laminated in this order. For silver coating, the thickness may be about 10 micrometers, for example. For the latter laminated structure, the thickness may be, for example, about 1 micrometer for nickel, about 0.03 micrometer for palladium, and about 0.008 micrometer for gold. Such coating can increase reflectance at the recess 20C and bonding strength of soldering.

The thickness T1 of the inner lead sections 20B and 30B may be about 1.2 millimeters, for example. The thickness T2 of the portion of the recess 20C where the LED chip 10 is mounted may be about 0.7 millimeter, for example. The thickness T3 of the outer lead sections 20A and 30A may be about 0.5 millimeter, for example. The LED chip 10 may have a square shape of 1 millimeter per side, for example, for high power type.

The embedding resin 40 may be made of thermoplastic resin, for example. Such resin may include nylon-based resin such as polyphthalamide (PPA), for example. The leads 20 and 30 can be insert molded using such thermoplastic embedding resin 40.

Use of thermoplastic resin for the embedding resin 40 results in high heat resistance and reliability. For example, use of epoxy resin for the embedding resin 40 slightly decreases heat resistance during solder reflow process and reliability for temperature cycle. This is because the thermal expansion coefficient of epoxy resin is much greater than that of metal constituting the leads. For this reason, if epoxy resin is used, expansion of heated epoxy resin may result in a problem of peeloff of the LED chip and/or disconnection of wire.

In contrast, use of thermoplastic resin for the embedding resin 40 improves heat resistance during solder reflow and reliability for temperature cycle. In particular, when titanium oxide or other filler is mixed in thermoplastic resin such as polyphthalamide, the thermal expansion coefficient can be decreased and softening at the time of heating can be prevented. For example, mixing of filler including titanium oxide at about 30 to 40 percent by weight results in a semiconductor light emitting device having extremely good heat resistance.

Furthermore, mixing or blending of reflective material in the embedding resin 40 can facilitate the reflecting effect at the sidewall of the recess 40C. For example, potassium titanate powder may be preferably mixed in the resin 40.

With regard to the outer dimensions of the embedding resin 40, for example, the length L may be about 7 millimeters, the width W may be about 5 millimeters, and the height H may be about 2 millimeters.

On the other hand, this embodiment is based on the structure in which the rear face of the leads 20 and 30 is exposed at the bottom face of the embedding resin 40. It is therefore desirable to use a structure having increased bonding strength to avoid peeloff of these leads from the embedding resin 40.

Figure 5A:
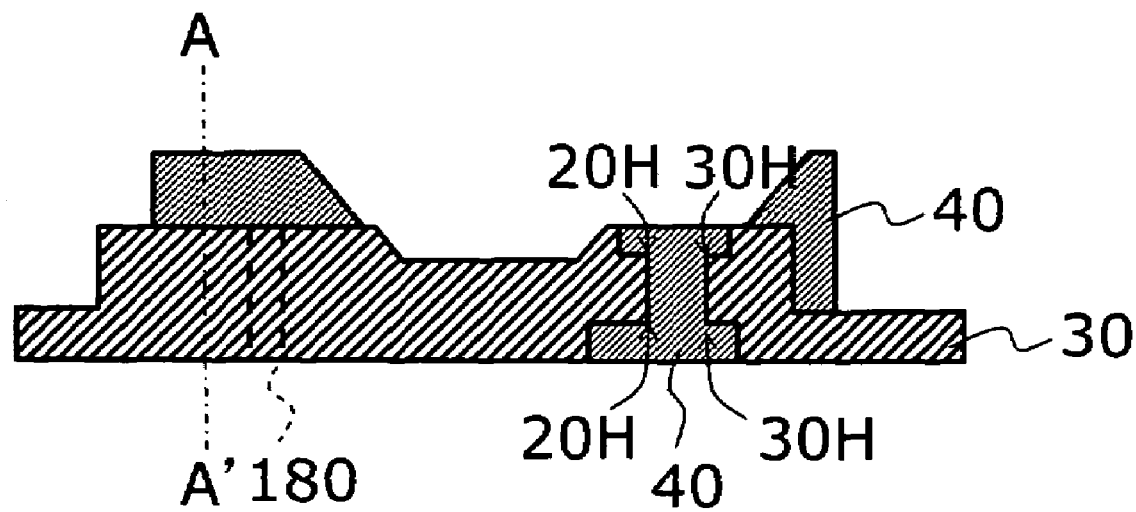
FIGS. 5A and 5B are schematic views illustrating the structure for enhancing bonding strength between leads 20, 30 and resin 40.
Figure 5B:
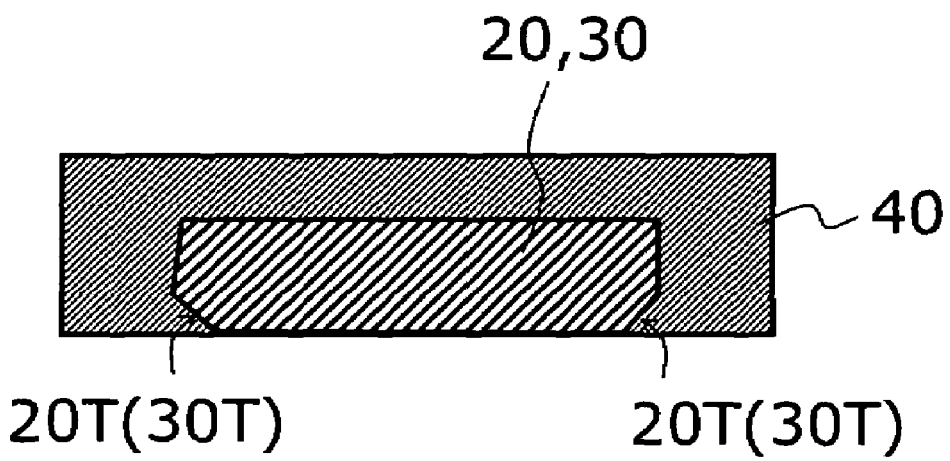

FIGS. 5A and 5B are schematic views illustrating the structure for enhancing bonding strength between leads 20, 30 and resin 40.

More specifically, anchor holes 180 are provided through the lead 20 (30) so that the embedding resin 40 may fill in these anchor holes 180. This serves to reduce "loosening" between the leads and the injection molded object and to increase adhesion strength and contact area, so that peeloff of the leads from the resin 40 can be prevented.

Moreover, asperities 20H and 30H can be provided at the tip of the inner lead sections of the lead 20 and 30 to improve "biting" to the resin 40, so that the bonding strength can be enhanced.

Furthermore, as shown as line A-A' cross section in FIG. 5B, a tapered portion 20T (30T) with its width decreasing toward the rear face may be provided on the sidewall of the lead 20 (30). This facilitates supporting the lead 20 (30) with the tapered portion 20T (30T) obliquely from below, thereby preventing peeloff of the resin 40.

The anchor holes 180, asperities 20H (30H), and tapered portion 20T (30T) described above can be formed by presswork of the leads 20 and 30. They serve to reduce "loosening" between the leads and the injection molded object and to increase adhesion strength and contact area, so that peeloff of the leads from the resin 40 can be prevented.

In the following, the semiconductor light emitting device of this embodiment will be described in more detail with reference to a method of manufacturing the same.

FIGS. 6 to 10 are process cross-sectional views illustrating the relevant part of a process of manufacturing a semiconductor light emitting device of this embodiment.

Figure 6:
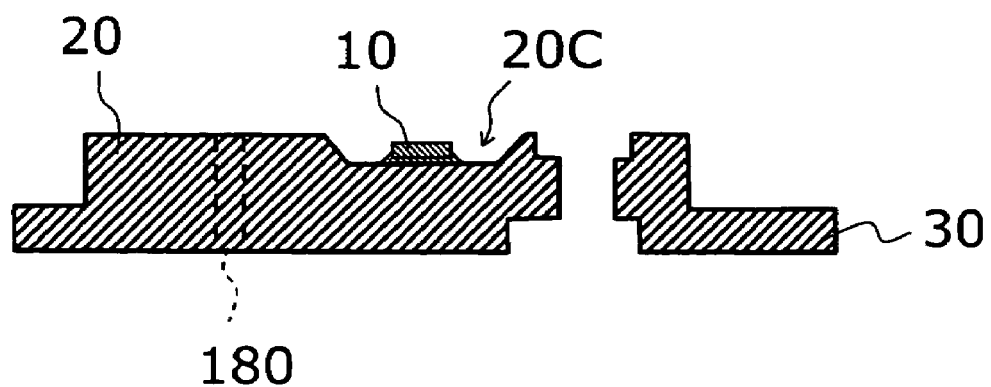
FIGS. 6 to 10 are process cross-sectional views illustrating the relevant part of a process of manufacturing a semiconductor light emitting device of this embodiment.

First, as shown in FIG. 6, the LED chip 10 is mounted on the recess 20C of the lead 20. It is desirable that the leads 20 and 30 be supplied in the form of the so-called "lead frame".

Figure 11:
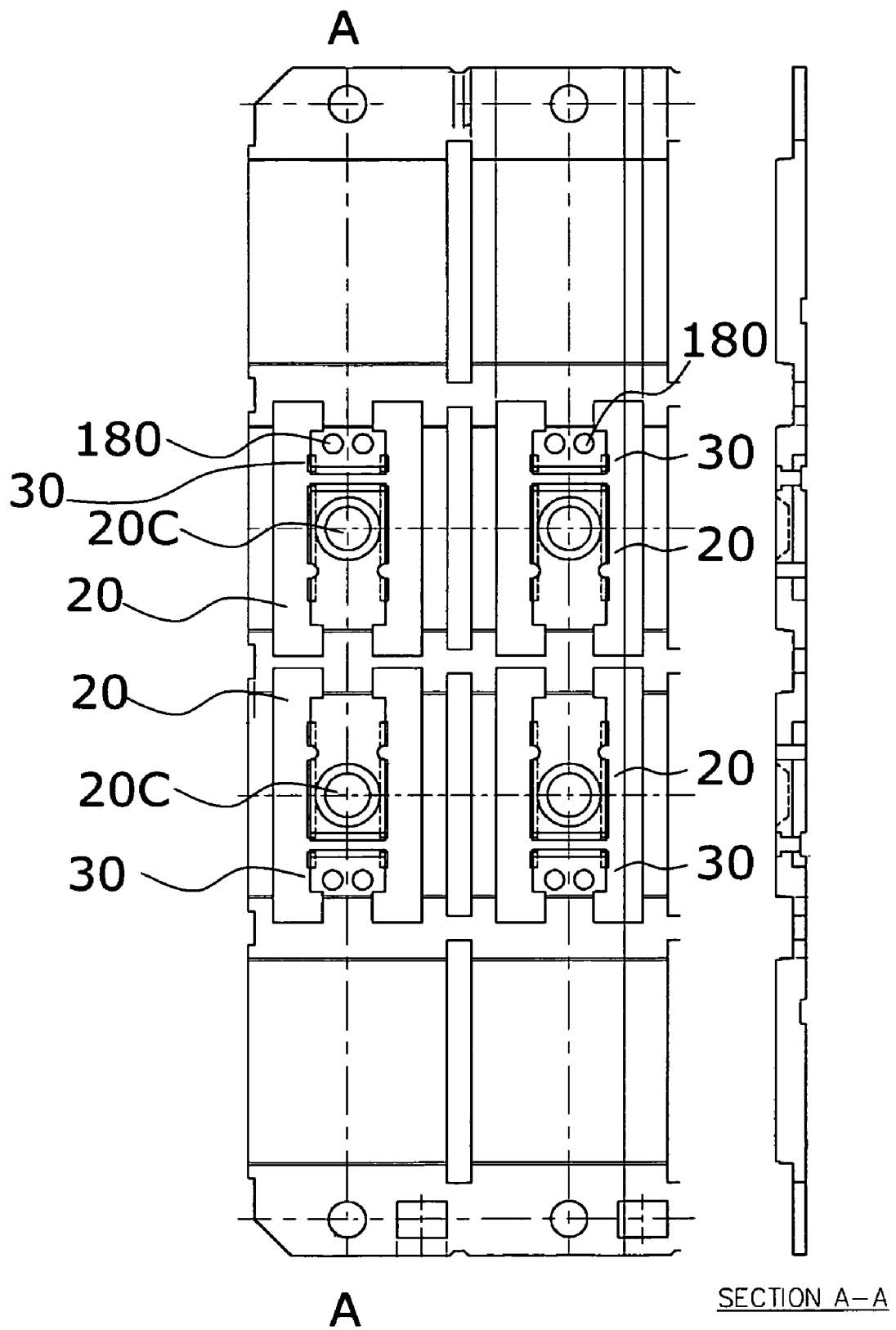
FIG. 11 is a schematic view showing a specific example of a lead frame.

FIG. 11 is a schematic view showing a specific example of such a lead frame.

Figure 12:
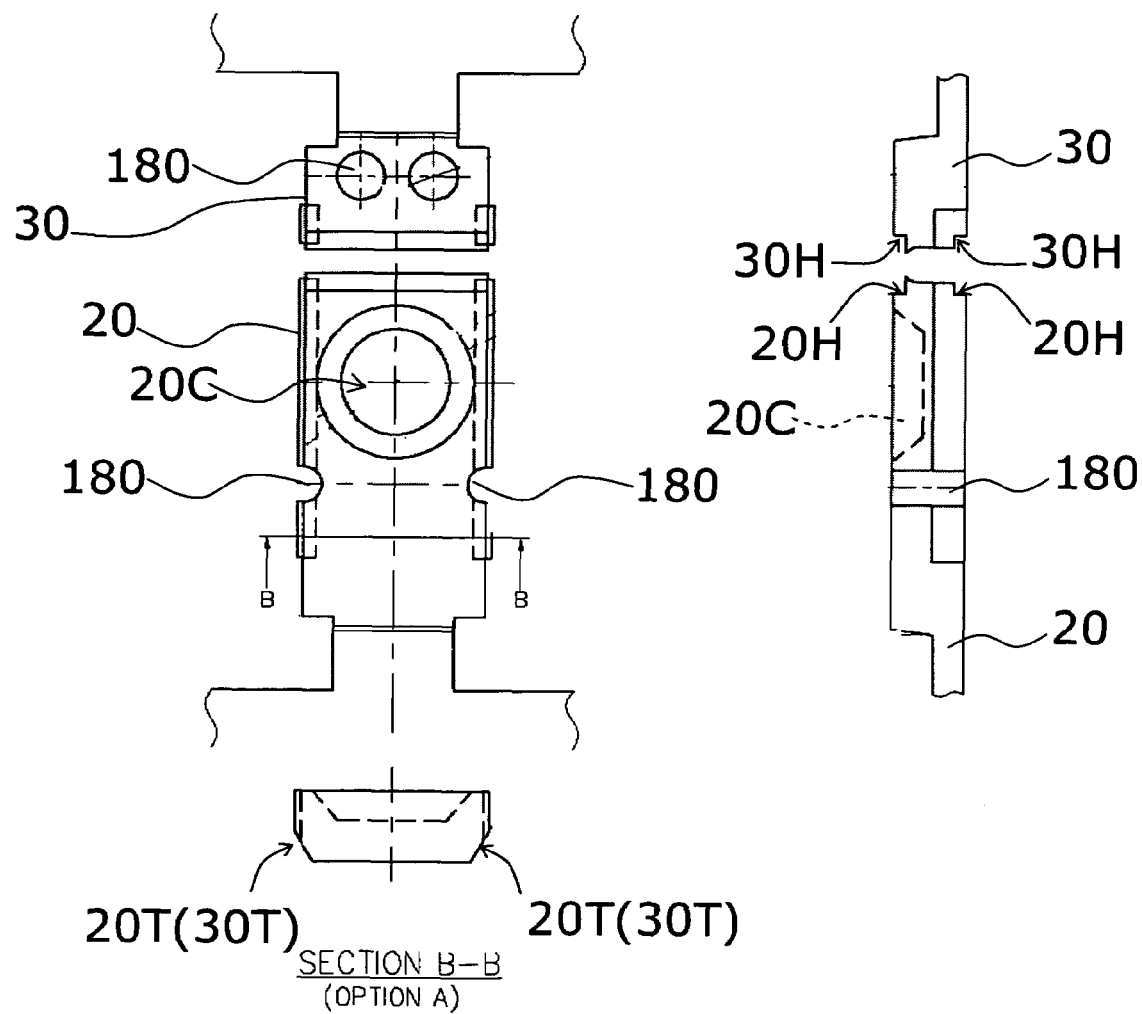
FIG. 12 is an enlarged schematic view of the portion of leads 20, 30 of the lead frame illustrated in FIG. 11.

FIG. 12 is an enlarged schematic view of the portion of a pair of leads 20, 30 of the lead frame illustrated in FIG. 11.

The lead frame of this specific example has anchor holes 180, asperities 20H (30H), and tapered portion 20T (30T) as described above with reference to FIGS. 5A and 5B. The anchor hole 180 is provided on the side face of the lead 20 as a notch.

The LED chip 10 can be die bonded with silver paste, eutectic solder (AuSn, AuGe, AuSi, etc.), or gold (Au) bump. For a high power (also high current) LED, it is desirable to use adhesive material resistant to high temperature operation because the p-n junction temperature is increased. For this reason, it is desirable to use eutectic solder or gold bump that achieves stable bonding strength at high temperatures. For example, since AuSn has a melting temperature of about 280° C., it is more reliable during high temperature operation than silver paste. Mounting with AuSn eutectic solder is often carried out at about 320° C.

After the LED chip 10 is mounted, embedding resin 40 is then insert molded.

Figure 7:
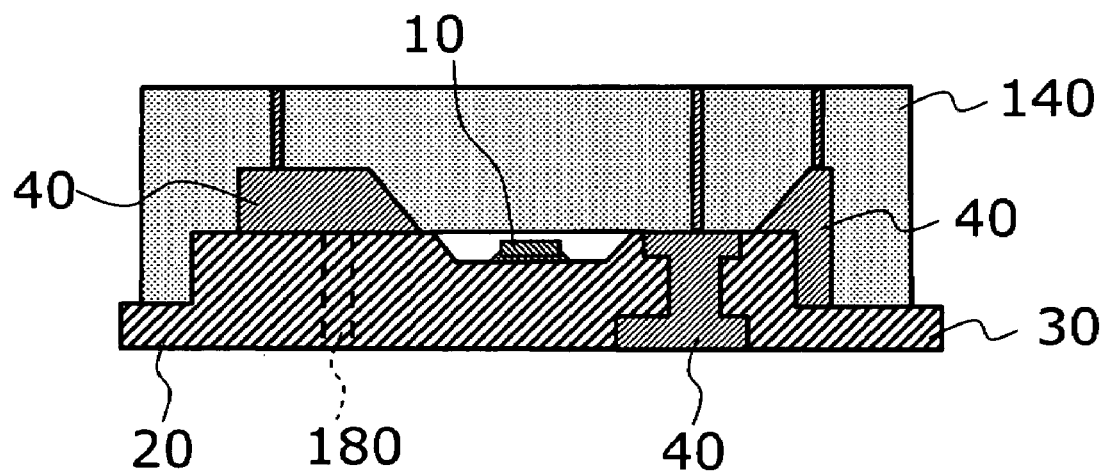

FIG. 7 shows a lead frame inserted into a molding die 140 for resin 40.

In this embodiment, the LED chip 10 is housed in the recess 20C of the lead 20. This allows insert molding without contact of the molding die 140 with the LED chip 10. That is, the resin 40 can be insert molded after the LED chip 10 is mounted.

The embedding resin 40 made of thermoplastic resin such as PPA has a heat resistance temperature of about 290° C. In this respect, use of eutectic solder requires the bonding temperature to be as high as about 320° C. That is, it is difficult to mount the LED chip 10 with eutectic solder after the embedding resin 40 is insert molded.

In contrast, according to the present embodiment, the LED chip 10 is mounted in the recess 20C of the lead. This allows insert molding without contact of the molding die 140 with the chip 10. As a result, die bonding with eutectic solder at high temperature can be followed by insert molding of resin. Therefore eutectic solder, which has high thermal reliability, can be used without thermal deterioration of the resin 40.

Figure 8:
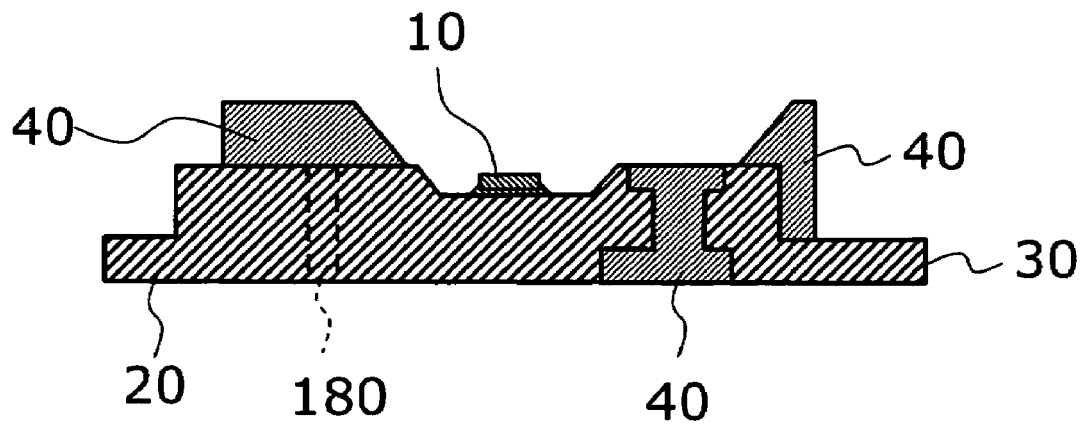

FIG. 8 shows the lead frame pulled out of the molding die 140 after completing insert molding.

Figure 13:
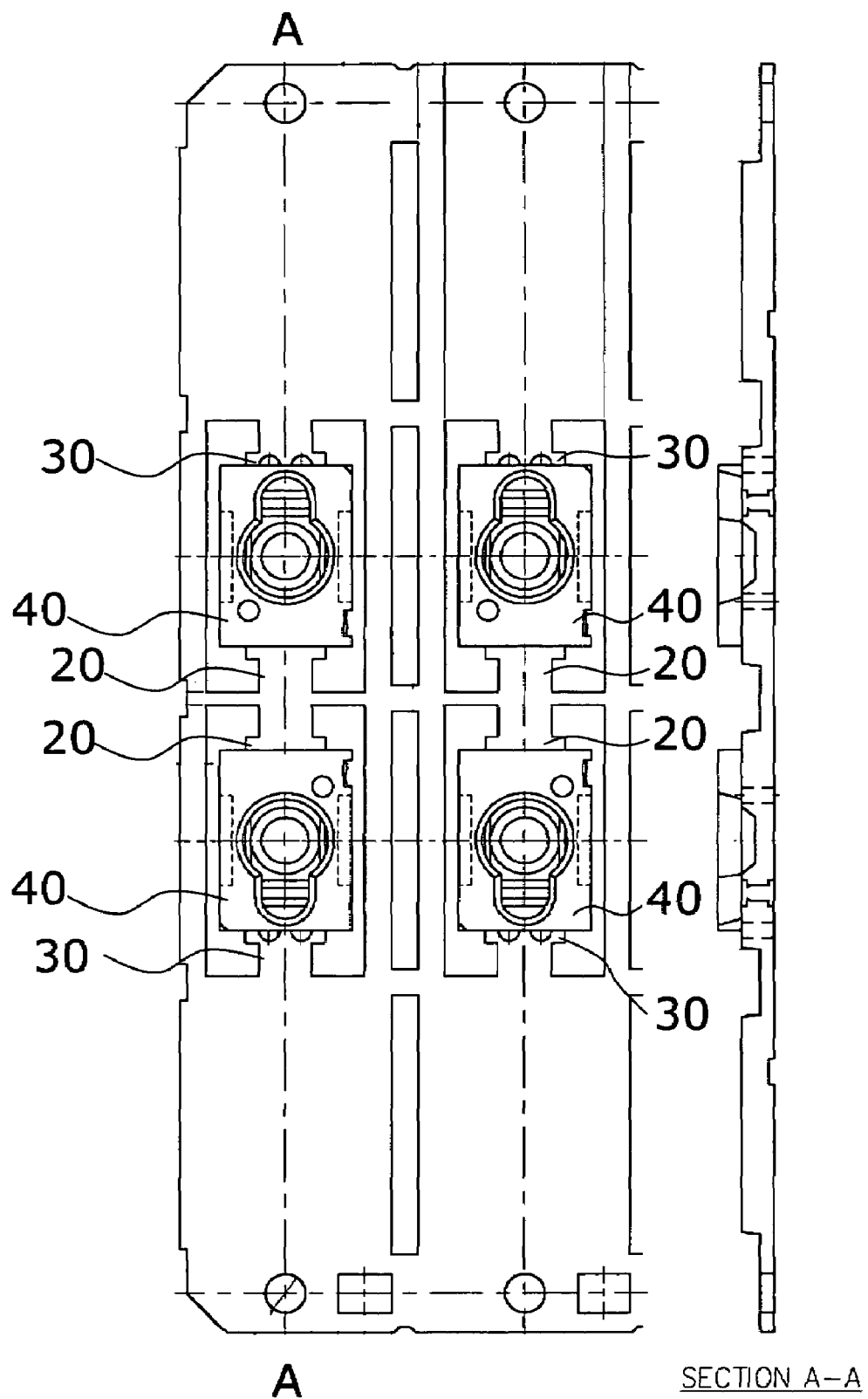
FIG. 13 is a schematic view showing a specific example of a lead frame with resin 40 molded thereon.

FIG. 13 is a schematic view showing a specific example of a lead frame with resin 40 molded thereon.

Figure 14:
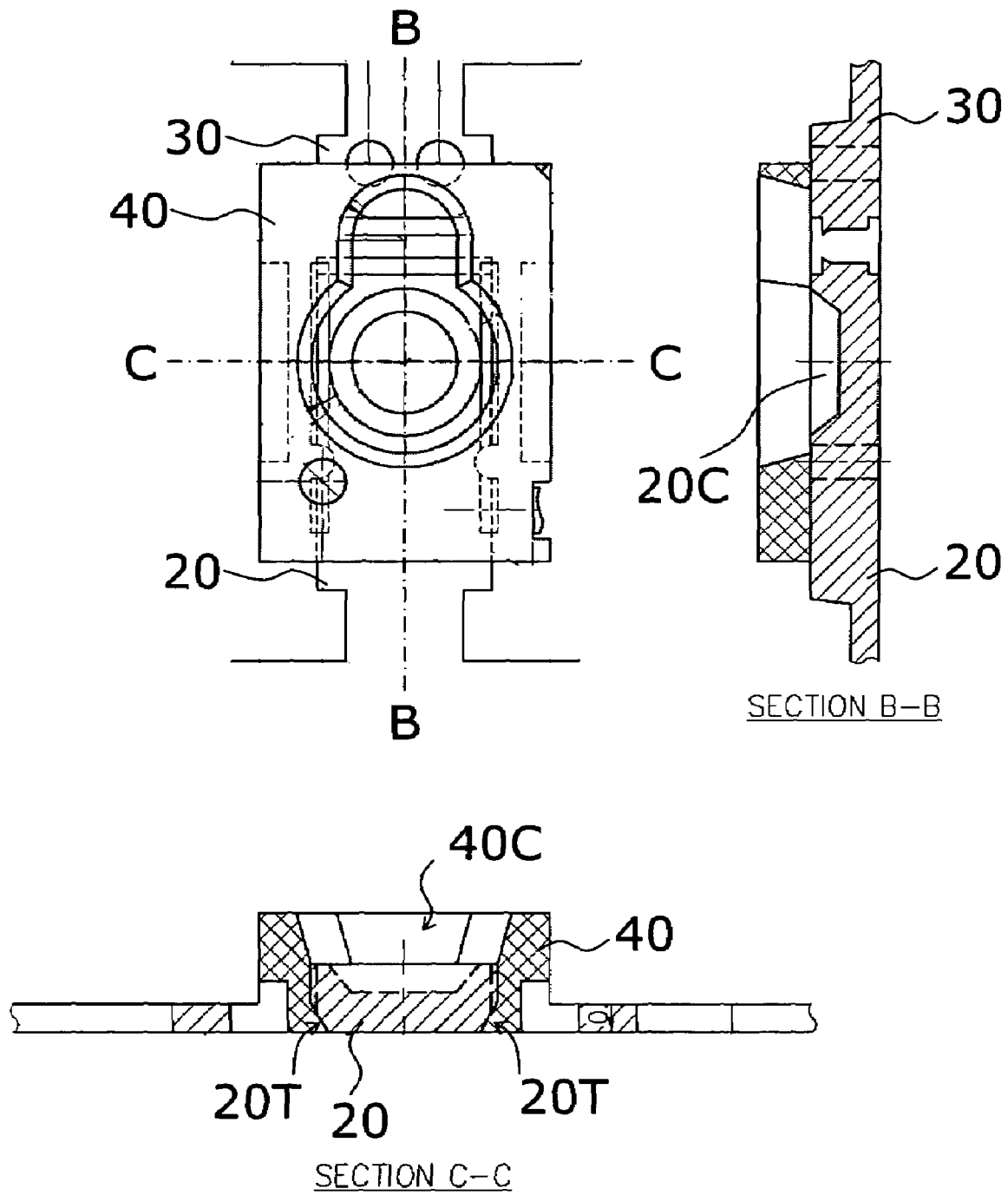
FIG. 14 is an enlarged schematic view of the portion of the leads 20, 30 of the lead frame as illustrated in FIG. 13.

FIG. 14 is an enlarged schematic view of the portion of the leads 20, 30 of the lead frame as illustrated in FIG. 13.

In this way, a lead frame with a plurality of leads 20, 30 arranged in parallel can be inserted into the molding die 140 to form resin 40 all at once.

Figure 9:
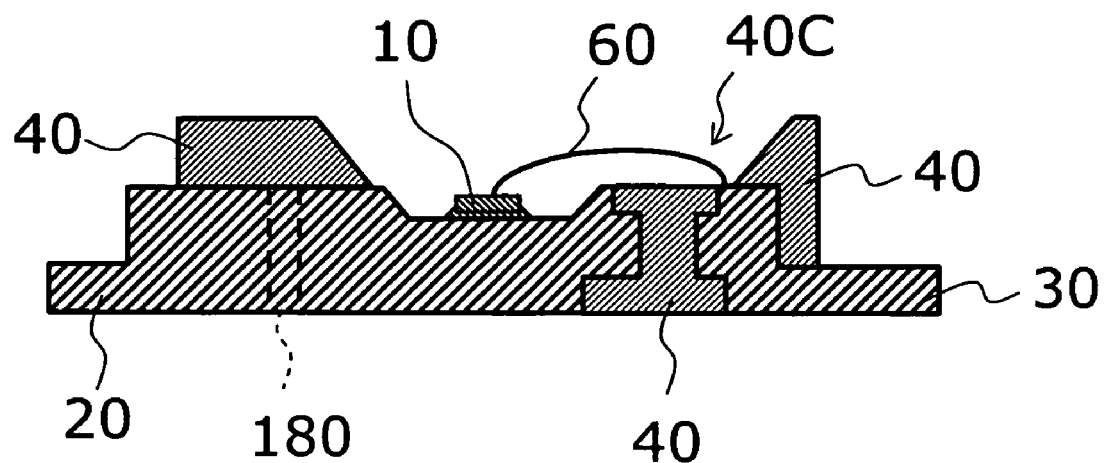

Subsequently, as shown in FIG. 9, the electrode (not shown) provided on the LED chip 10 is wire bonded via gold (Au) or other wire to the inner lead section 30B of the lead 30 exposed at the bottom of the recess 40C of the resin.

Figure 10:
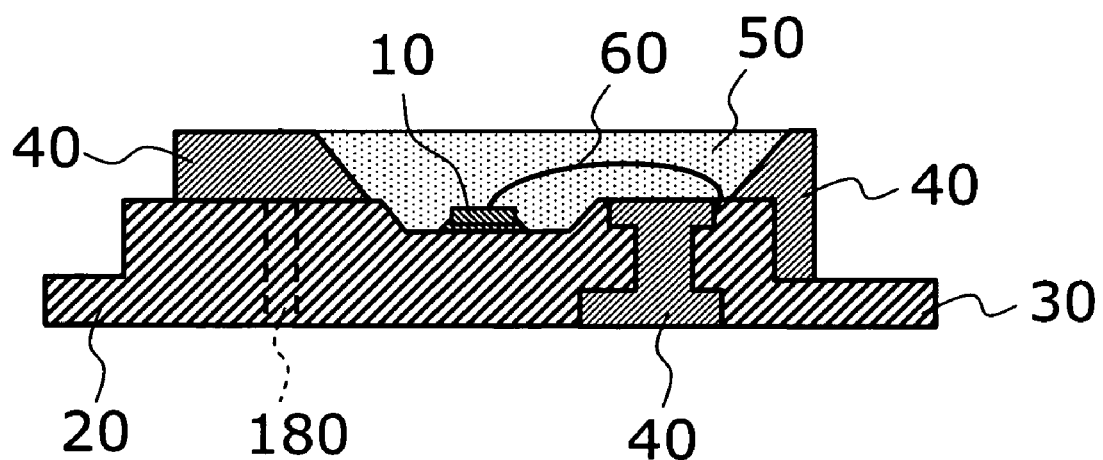

Next, as shown in FIG. 10, the LED chip 10 and the wire 60 are sealed by filling the recess 40C of the embedding resin 40 with resin.

Subsequently, a series of semiconductor light emitting devices linked by the lead frame are individually separated by lead cutting to complete the manufacturing process. Automation of manufacturing apparatuses (die bonder, wire bonder, molding machine, lead cutter, etc.) used in various steps of the above process can ensure high productivity and reliability.

The semiconductor light emitting device and a method of manufacturing the same according to the embodiment of the invention have been described. In the following, variations of the semiconductor light emitting device of this embodiment will be described.

Figure 15A:
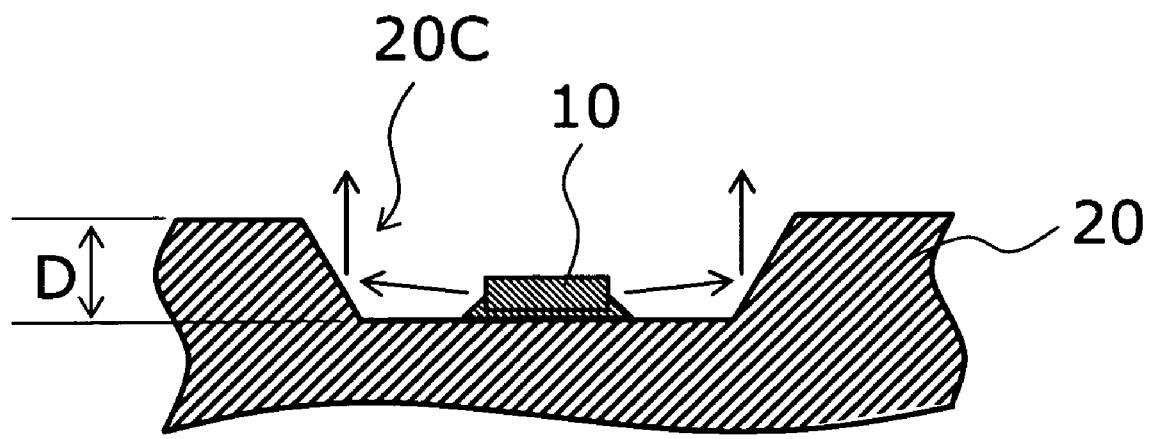
FIGS. 15A and 15B are schematic cross-sectional views showing the relevant part of a first variation of the semiconductor light emitting device of this embodiment.
Figure 15B:
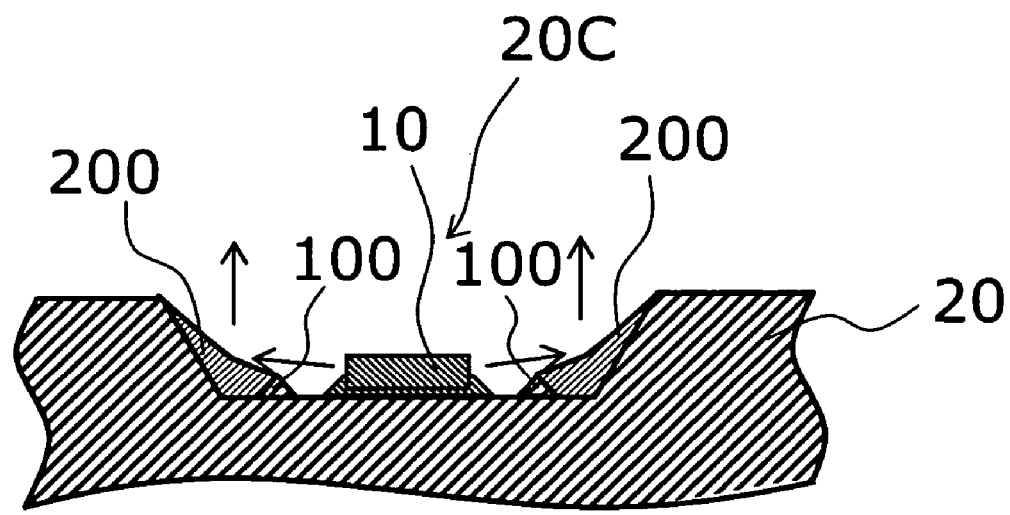

FIGS. 15A and 15B are schematic cross-sectional views showing the relevant part of a first variation of the semiconductor light emitting device of this embodiment.

More specifically, as shown in FIG. 15A, the depth D of the recess 20C may be greater than the thickness of the LED chip 10. As described earlier, this serves to protect the LED chip 10 against the molding die 140. In addition, the light emitted from the LED chip 10 is reflected at the sidewall of the recess 20C and can be extracted upward.

Furthermore, as shown in FIG. 15B, a salient portion 100 is provided around the chip 10 in the recess 20C and its outside is filled with reflective material 200. This serves to efficiently reflect the light laterally emitted from the chip 10 and the light can be extracted upward as shown by arrows in the figure. For example, the reflective material 200 may include fine particles of potassium titanate. Such fine particles can be mixed in the resin for infilling to efficiently reflect the light emitted from the LED chip 10. More specifically, the light extraction efficiency can be significantly increased because of the reflecting position closer to the chip 10 than in the case of reflecting at the sidewall of the recess 20C as shown in FIG. 15A, and because of high reflectance of the material 200.

Figure 16:
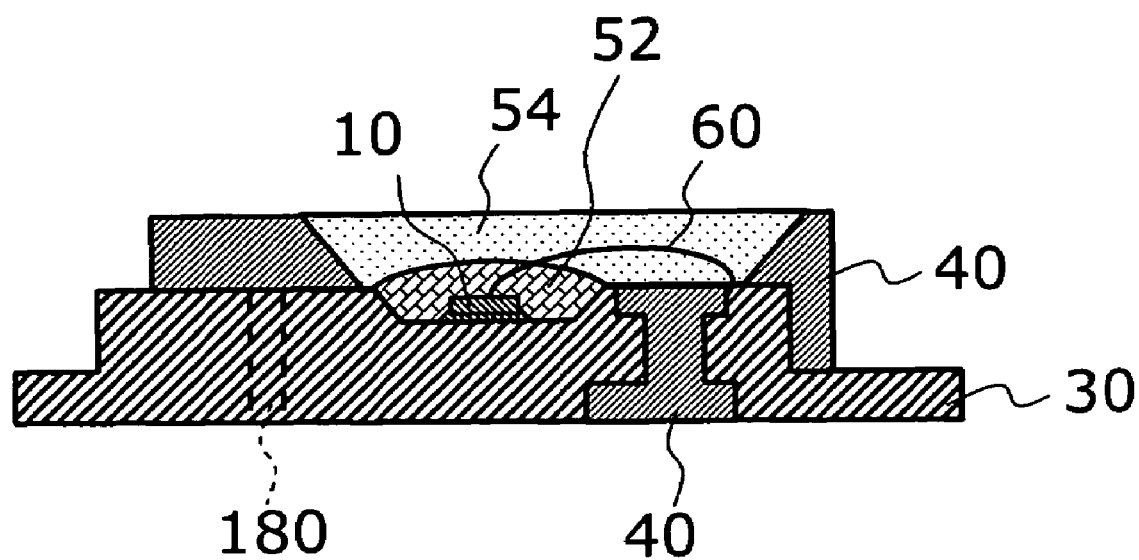
FIG. 16 is a schematic cross-sectional view showing a second variation of the semiconductor light emitting device of this embodiment.

FIG. 16 is a schematic cross-sectional view showing a second variation of the semiconductor light emitting device of this embodiment.

This variation includes first sealing resin 52 for sealing the LED chip 10 and second sealing resin 54 for further sealing its outside.

For example, the first sealing resin 52 may be mechanically soft resin having relatively low hardness. This serves to reduce mechanical stress applied to the LED chip 10 and to alleviate the problem of crack and peeloff. In this case, the second sealing resin 54 may be made of resin having high mechanical strength to withstand application of external force and impact.

In addition, for example, the LED chip 10 may be an ultraviolet light emitting chip, the first sealing resin 52 may be silicone resin containing phosphors dispersed therein, and the second sealing resin 54 may be epoxy resin. Ultraviolet radiation emitted from the LED chip 10 is wavelength converted by phosphors contained in the first sealing resin 52 into visible light, for example. This visible light transmits through the second sealing resin made of epoxy resin and can be extracted outside. Since ultraviolet radiation is wavelength converted by phosphors, the second sealing resin 54 made of epoxy resin does not suffer from discoloration or other problems. Furthermore, use of the epoxy resin for the material of the second sealing resin 54 serves to improve durability against application of external force and impact.

Figure 17:
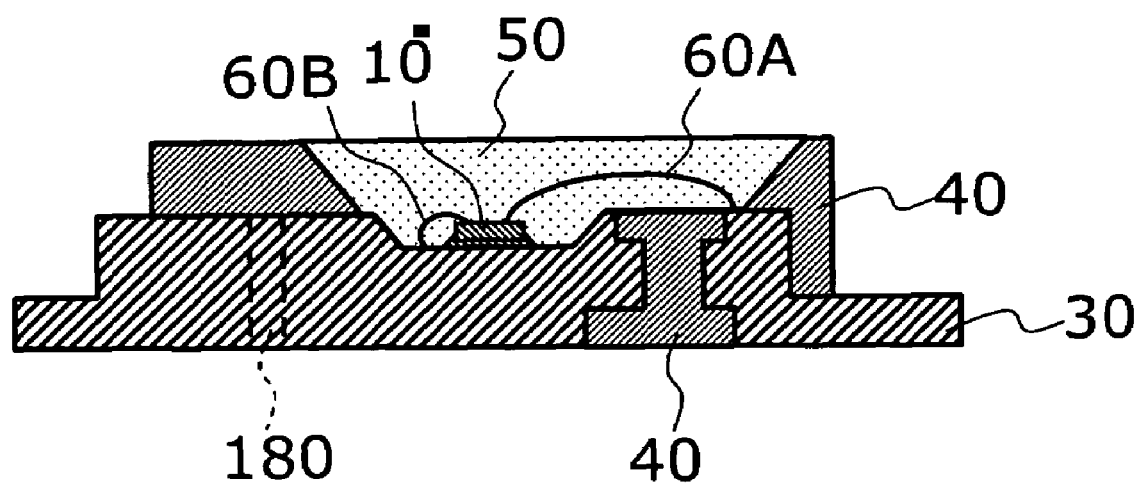
FIG. 17 is a schematic cross-sectional view showing a third variation of the semiconductor light emitting device of this embodiment.

FIG. 17 is a schematic cross-sectional view showing a third variation of the semiconductor light emitting device of this embodiment.

In this variation, the LED chip 10 is connected to the lead 30 via a first wire 60A, and to the lead 20 via a second wire 60B. This is beneficial in the case where, for example, the LED chip 10 is formed on an insulating substrate. More specifically, sapphire may be used for a substrate for epitaxial growth of gallium nitride based semiconductor material. In this case, the anode and cathode of the LED chip 10 are provided on its upper face. For this reason, the chip 10 needs to be connected to the lead 20 via a second wire 60B.

Furthermore, any other semiconductor chip such as a protecting diode (not shown) mounted in conjunction with the LED chip 10 can also be connected via the second wire 60B in this way.

Figure 18A:
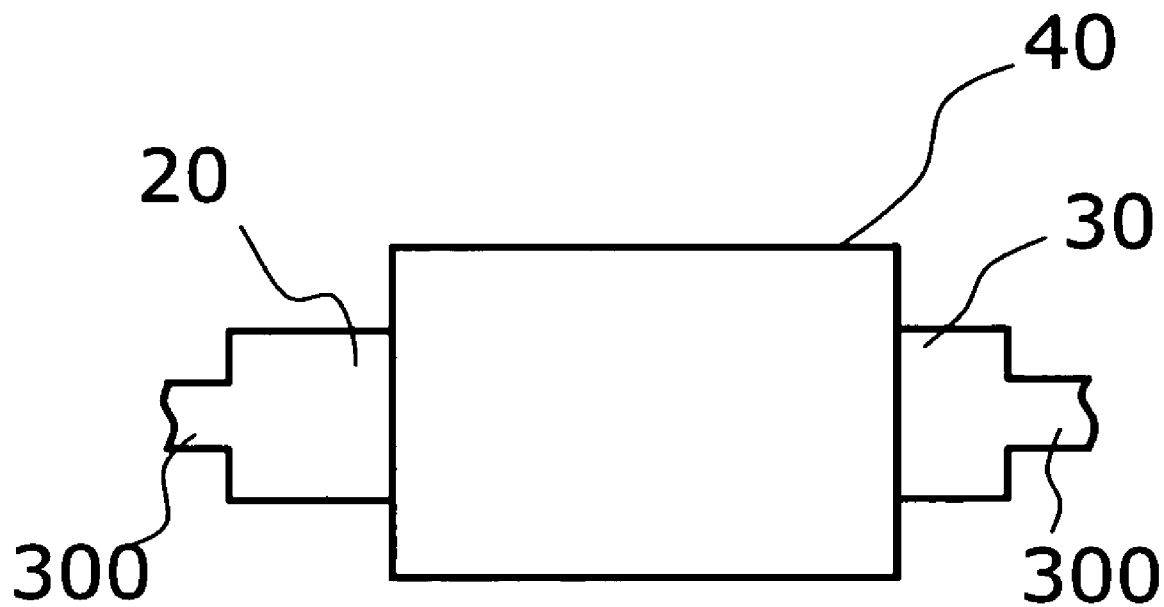
FIGS. 18A and 18B are schematic cross-sectional views showing a fourth variation of the semiconductor light emitting device of this embodiment.
Figure 18B:
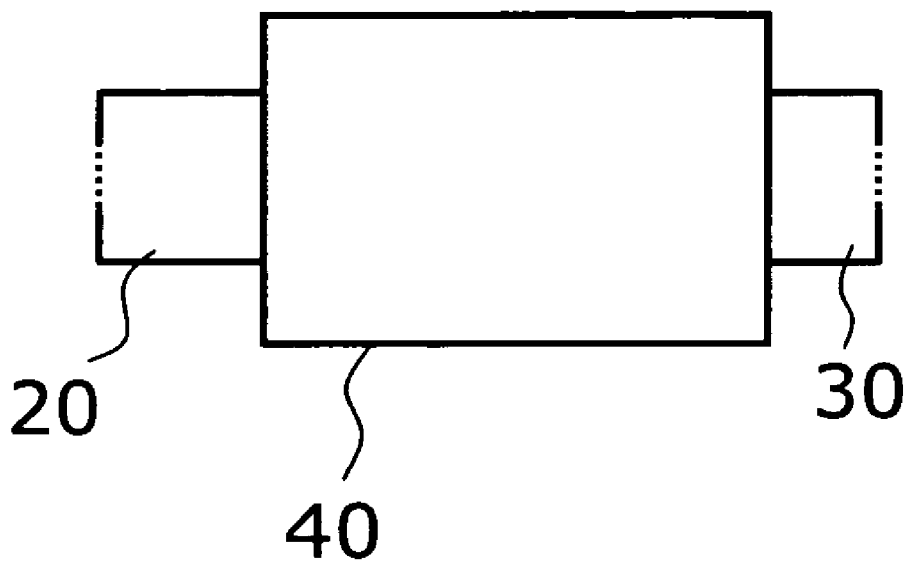

FIGS. 18A and 18B are schematic cross-sectional views showing a fourth variation of the semiconductor light emitting device of this embodiment.

In this variation, the connecting portion 300 between the lead 20, 30 and the lead frame is formed narrower in width than the lead 20, 30. When a semiconductor light emitting device of this embodiment is manufactured from a lead frame, it is necessary to separate the semiconductor light emitting device by cutting it off from the lead frame connected as illustrated in FIG. 13, for example.

However, if the lead frame is plated with silver or the like, an unplated surface of base material is exposed at the cut section, which may cause deterioration of solderability. In contrast, according to this variation, the narrowed width of the connecting portion 300 serves to decrease the area of the exposed portion of the base material surface after lead cutting, so that deterioration of solderability can be prevented.

Figure 19:
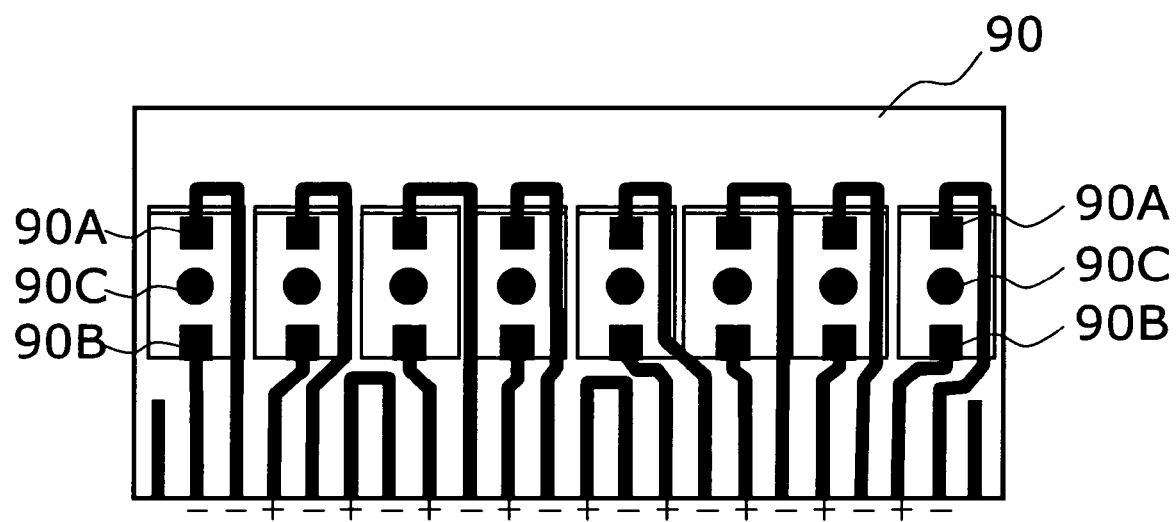
FIG. 19 is a plan view showing an example of a mounting substrate for use in a semiconductor light emitting unit of this embodiment.

FIG. 19 is a plan view showing an example of a mounting substrate for use in a semiconductor light emitting unit of this embodiment.

In this specific example, the mounting substrate 90 has an electrode pattern in which a plurality of semiconductor light emitting devices can be arranged in parallel. More specifically, electrode regions 90A and 90B are provided corresponding to the outer lead sections 20A and 30A of the leads of each semiconductor light emitting device. Additionally provided is an electrode region 90C for soldering at a portion directly below the chip of each semiconductor light emitting device.

In this way, this embodiment enables soldering on the mounting substrate directly below the chip, thereby facilitating heat dissipation as described above with reference to FIG. 4. This leads to a semiconductor light emitting unit capable of stable, high power operation even under high current flow.

Embodiments of the invention have been described with reference to specific examples. However, the invention is not limited to these specific examples.

For example, the material of the LED chip is not limited to InGaAlP-based or GaN-based semiconductors, but may include various other Group III-V compound semiconductors such as GaAlAs-based and InP-based semiconductors, or Group II-VI compound semiconductors, or various other semiconductors.

Any shape, size, material, and arrangement of various elements including the LED chip, leads, embedding resin, and sealing resin constituting the semiconductor light emitting device that are adapted in various ways by those skilled in the art are also encompassed within the scope of the invention as long as they have any of the features of the invention.

The invention claimed is:

1. A semiconductor light emitting device comprising: embedding resin;
a first lead having a first inner lead section embedded in the embedding resin and a first outer lead section protruding from one side face of the embedding resin;
a second lead having a second inner lead section embedded in the embedding resin and a second outer lead section protruding from a side face opposed to the one side face of the embedding resin;
a semiconductor light emitting chip mounted on a portion of the first inner lead section exposed in a recess provided on an upper face of the embedding resin; and
a wire connecting the semiconductor light emitting chip with the second lead,
the first inner lead section and the second inner lead section being physically separate,
the first and second inner lead sections and the first and second outer lead sections each having a substantially coplanar rear face, and
at least a part of the rear face of the first inner lead section and at least a part of the rear face of the second inner lead section being not covered with the embedding resin but being exposed,
wherein
the first inner lead section has a first thickened portion having a thickness greater than that of a tip of the first outer lead section,
the first outer lead section has a second thickened portion having a thickness greater than that of a tip thereof, and
the first and second thickened portions are continuously provided.

2. A semiconductor light emitting device according to claim 1, wherein
the first inner lead section has a recess, and the semiconductor light emitting chip is mounted on a bottom face of the recess.

3. A semiconductor light emitting device according to claim 2, wherein a salient portion is provided around the semiconductor light emitting chip, and the outside of the salient portion as viewed from the semiconductor light emitting chip is filled with resin containing light reflective material.

4. A semiconductor light emitting device according to claim 2, wherein the recess of the first inner lead section has a depth greater than the thickness of the semiconductor light emitting chip.

5. A semiconductor light emitting device according to claim 1, wherein the embedding resin is thermoplastic resin.

6. A semiconductor light emitting device according to claim 5, wherein the thermoplastic resin contains titanium oxide.

7. A semiconductor light emitting device according to claim 1, wherein the embedding resin has a rear face substantially coplanar with the rear faces of the first and second inner lead sections and the first and second outer lead sections.

8. A semiconductor light emitting device according to claim 1, wherein the portion of the first inner lead section on which the semiconductor light emitting chip is mounted has a thickness greater than that of a tip of the first outer lead section.

9. A semiconductor light emitting device according to claim 1, further comprising sealing resin for sealing the semiconductor light emitting chip provided in the recess and the wire.

10. A semiconductor light emitting device according to claim 1, wherein a side face of the recess has a tapered portion having a width decreasing toward a bottom face thereof.

11. A semiconductor light emitting device according to claim 1, wherein the semiconductor light emitting chip is mounted on the first inner lead section with eutectic solder or gold bump.

12. A semiconductor light emitting device according to claim 1, wherein at least a portion of the second inner lead section has a thickness greater than that of a tip of the second outer lead section.

13. A semiconductor light emitting unit comprising:
  a mounting substrate having a first electrode pad and a second electrode pad; and
  a semiconductor light emitting device including:
    embedding resin;
    a first lead having a first inner lead section embedded in the embedding resin and a first outer lead section protruding from one side face of the embedding resin;
    a second lead having a second inner lead section embedded in the embedding resin and a second outer lead section protruding from a side face opposed to the one side face of the embedding resin;
    a semiconductor light emitting chip mounted on a portion of the first inner lead section exposed in a recess provided on an upper face of the embedding resin; and
    a wire connecting the semiconductor light emitting chip with the second lead,
    the first inner lead section and the second inner lead section being physically separate,
    the first and second inner lead sections and the first and second outer lead sections each having a substantially coplanar rear face, and
    at least a part of the rear face of the first inner lead section and at least a part of the rear face of the second inner lead section being not covered with the embedding resin but being exposed,
  one of the first and second outer lead sections being connected with one of the first and second electrode pads, and
  other of the first and second outer lead sections being connected with other of the first and second electrode pads,
  wherein
  the first inner lead section has a first thickened portion having a thickness greater than that of a tip of the first outer lead section,
  the first outer lead section as a second thickened portion having a thickness greater than that of a tip thereof, and
  the first and second thickened portions are continuously provided.

14. A semiconductor light emitting unit according to claim 13, wherein the mounting substrate further includes a contact pad provided between the first and second electrode pads, and at least a rear face of a part of the mounting substrate where the semiconductor light emitting device is mounted, is connected with the contact pad.

15. A semiconductor light emitting unit according to claim 14, wherein the rear face of a part where the semiconductor light emitting device is mounted, is connected with the contact pad by a solder.

16. A semiconductor light emitting unit according to claim 13, wherein the embedding resin has a rear face substantially coplanar with the rear faces of the first and second inner lead sections and the first and second outer lead sections.

17. A semiconductor light emitting unit according to claim 13, wherein the portion of the first inner lead section on which the semiconductor light emitting chip is mounted has a thickness greater than that of a tip of the first outer lead section.

18. A semiconductor light emitting unit according to claim 13, wherein at least a portion of the second inner lead section has a thickness greater than that of a tip of the second outer lead section.

19. A semiconductor light emitting device comprising:
  embedding resin;
  a first lead having a first inner lead section embedded in the embedding resin and a first outer lead section protruding from one side face of the embedding resin;
  a second lead having a second inner lead section embedded in the embedding resin and a second outer lead section protruding from a side face opposed to the one side face of the embedding resin;
  a semiconductor light emitting chip mounted on a portion of the first inner lead section exposed in a recess provided on an upper face of the embedding resin; and
  a wire connecting the semiconductor light emitting chip with the second lead,
  the first inner lead section and the second inner lead section being physically separate,
  the first and second inner lead sections and the first and second outer lead sections each having a substantially coplanar rear face, and
  at least a part of the rear face of the first inner lead section and at least a part of the rear face of the second inner lead section being not covered with the embedding resin but being exposed, wherein at least a portion of the second inner lead section has a thickness greater than that of a tip of the second outer lead section.

20. A semiconductor light emitting device according to claim 19, wherein the embedding resin has a rear face substantially coplanar with the rear faces of the first and second inner lead sections and the first and second outer lead sections.

* * * * *

UNITED STATES PATENT AND TRADEMARK OFFICE
CERTIFICATE OF CORRECTION

| | |
|---|---|
| PATENT NO. | : 7,291,866 B2 |
| APPLICATION NO. | : 11/149461 |
| DATED | : November 6, 2007 |
| INVENTOR(S) | : Hiroaki Oshio et al. |

It is certified that error appears in the above-identified patent and that said Letters Patent is hereby corrected as shown below:

In Column 12, Claim 13, Line 15:
    Replace "section as" with --section has--

Signed and Sealed this

Twenty-third Day of September, 2008

JON W. DUDAS
*Director of the United States Patent and Trademark Office*